(12) United States Patent
Lu et al.

(10) Patent No.: US 9,557,636 B2
(45) Date of Patent: Jan. 31, 2017

(54) EXTREME ULTRAVIOLET LITHOGRAPHY MASK AND MULTILAYER DEPOSITION METHOD FOR FABRICATING SAME

(71) Applicant: Taiwan Semiconductor Manufacturing Company, Ltd., Hsin-Chu (TW)

(72) Inventors: Yen-Cheng Lu, Taipei (TW); Shinn-Sheng Yu, Hsinchu (TW); Anthony Yen, Hsinshu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 106 days.

(21) Appl. No.: 14/479,411

(22) Filed: Sep. 8, 2014

(65) Prior Publication Data

US 2014/0377693 A1    Dec. 25, 2014

Related U.S. Application Data

(63) Continuation of application No. 13/567,900, filed on Aug. 6, 2012, now Pat. No. 8,828,625.

(51) Int. Cl.
*G03F 1/24*        (2012.01)
*G03F 1/52*        (2012.01)

(52) U.S. Cl.
CPC .. *G03F 1/24* (2013.01); *G03F 1/52* (2013.01)

(58) Field of Classification Search
CPC .............. G03F 1/24; G03F 7/162; G03F 1/52; C23C 14/34
See application file for complete search history.

(56) References Cited

U.S. PATENT DOCUMENTS

| | | |
|---|---|---|
| 6,489,066 B2 | 12/2002 | Mirkanimi |
| 7,282,305 B2 | 10/2007 | Shoki |
| 7,504,185 B2 | 3/2009 | Ikuta |
| 2007/0077499 A1 | 4/2007 | Ikuta et al. |
| 2014/0038090 A1 | 2/2014 | Yen-Cheng Lu |

OTHER PUBLICATIONS

Pei-Cheng Hsu et al., "Printability of Buried Mask Defects in Extreme-L'V Lithography,", Proc. Of SPIE vol. 7969, pp. 7969D1-D11.

*Primary Examiner* — Stephen Rosasco
(74) *Attorney, Agent, or Firm* — Haynes and Boone, LLP

(57) ABSTRACT

A mask, method of fabricating same, and method of using same are disclosed. In an example, a mask includes a substrate and a reflective multilayer coating deposited over the substrate. The reflective multilayer coating is formed by positioning the substrate such that an angle α is formed between a normal line of the substrate and particles landing on the substrate and rotating the substrate about an axis that is parallel with a landing direction of the particles. In an example, reflective multilayer coating includes a first layer and a second layer deposited over the first layer. A phase defect region of the reflective multilayer coating includes a first deformation in the first layer at a first location, and a second deformation in the second layer at a second location, the second location laterally displaced from the first location.

20 Claims, 4 Drawing Sheets

US 9,557,636 B2

EXTREME ULTRAVIOLET LITHOGRAPHY MASK AND MULTILAYER DEPOSITION METHOD FOR FABRICATING SAME

PRIORITY DATA

This application is a continuation application of U.S. application Ser. No. 13/567,900, filed Aug. 6, 2012, which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. For example, higher resolution lithography processes, such as extreme ultraviolet (EUV) lithography processes, are implemented to meet size constraints approaching critical dimension tolerances of 32 nm technology nodes and below. EUV lithography uses a reflective mask (also referred to as a reticle) to transfer a pattern of a layer of an integrated circuit device to a wafer. A reflective mask typically includes a reflective multilayer coating (multilayer mirror) deposited on a substrate. Any defects, including microscopic defects, in the substrate causes deformations in material layers of the reflective multilayer coating that undesirably affect printability of the pattern of the reflective mask. Such defects are often difficult to inspect and, even if detected, difficult to repair. Accordingly, although existing EUV masks and methods of manufacturing EUV masks have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
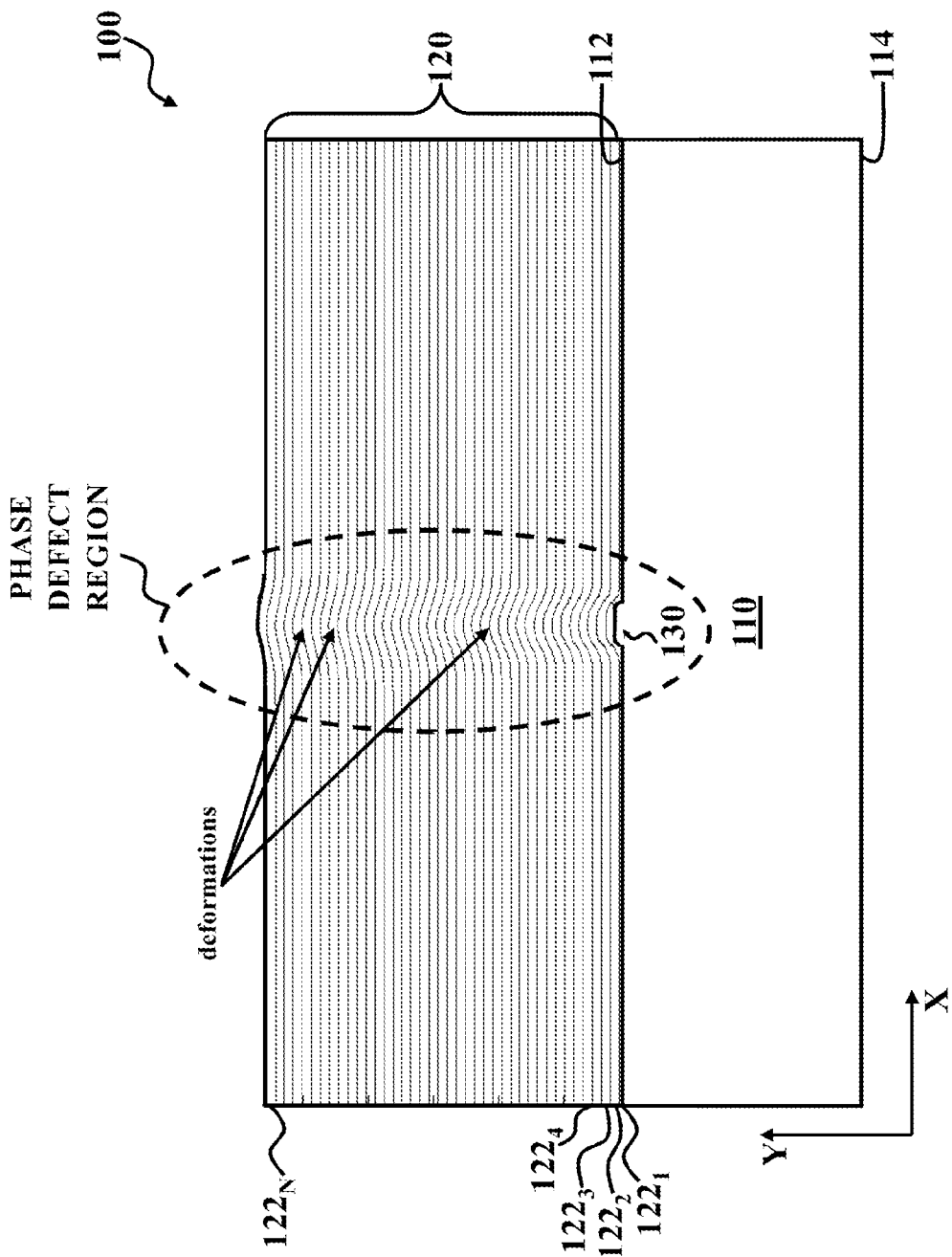
FIG. 1 is a diagrammatic cross-sectional side view of a mask according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a diagrammatic cross-sectional side view of a mask 100 (also referred to as a photomask or a reticle) according to various aspects of the present disclosure. In the depicted embodiment, the mask 100 is a mask blank that will undergo a mask fabrication process to pattern the mask blank with a design of a layer of an integrated circuit (IC) device. FIG. 1 has been simplified for the sake of clarity to better understand the inventive concepts of the present disclosure. Additional features can be added in the mask 100, and some of the features described below can be replaced or eliminated for additional embodiments of the mask 100.

The mask 100 includes a substrate 110. The substrate 110 has a surface 112 and a surface 114 that is opposite the surface 112. In the present example, the substrate 110 includes a low thermal expansion material (LTEM). In an example, the LTEM substrate includes titania ($TiO_2$) doped fused silica ($SiO_2$). Alternatively, the substrate 110 includes other materials, such as quartz or glass, depending on design requirements of the mask 100.

A reflective multilayer coating (RMLC) 120 (also referred to as a multilayer mirror (MLM)) is deposited over the substrate 110, particularly over a surface 112 of the substrate 110. The RMLC 120 includes multiple material layers $122_1$, $122_2$, $122_3$, $122_4$, . . . $122_N$, where N is a total number of the material layers of the RMLC 120. Hereafter, for ease of discussion, "a material layer" or "material layers" is simply referred to as "a layer" or "layers." In the present example, in relation to the surface 112 of the substrate 110, the layer $122_1$ may be referred to as a bottommost layer of the RMLC 120, and the layer $122_N$ may be referred to as the topmost layer of the RMLC 120. In furtherance of the present example, the multiple layers $122_1$, $122_2$, $122_3$, $122_4$, . . . $122_N$ form a number of layer pairs, where each layer pair includes two layers having different refractive indices (in other words, a combination of a first material and a second material, where a refractive index of the first material is different than a refractive index of the second material). For example, a layer pair includes layer $122_1$ and layer $122_2$, another layer pair includes layer $122_3$ and layer $122_4$, and so forth. The combination of the materials in the layer pair is selected to provide a large difference in refractive indices between the two layers (for example, to achieve large reflectivity at an interface of the two layers according to Fresnel equations), yet to provide small extinction coefficients for the layers (for example, to minimize absorption). In an example, the RMLC 120 includes molybdenum-silicon (Mo/Si) layer pairs. In another example, the RMLC 120 includes molybdenum-beryllium (Mo/Be) layer pairs. A thickness of each layer of each layer pair of the RMLC 120 is adjusted depending on a wavelength and an angle of incidence of light (such as extreme ultraviolet (EUV) radiation) incident on the mask 100, such that the mask 100 achieves maximum constructive interference of light reflected from different interfaces of the RMLC 120. In general, reflectivity of the RMLC increases as a number of layer pairs of the RMLC 120 increases. Accordingly, in principle, if the number of layer pairs is sufficiently large and extinction coefficients of the materials of the layers in the layer pairs are close to zero, reflectivity of the RMLC 120 can approach 100% regardless of the difference of the refractive indices of the materials of the layers in the layer pairs. However, in the EUV wavelength range, the highest reflectivity that can be achieved is limited by the extinction coefficients of the materials employed for the layers of the RMLC 120. In the present example, the number of layer pairs of the RMLC 120 is about twenty pairs to about eighty pairs. For example, in the depicted embodiment, to achieve more than 95% reflectivity of the RMLC 120 and minimize mask blank manufacturing time and costs, the RMLC 120 includes about forty layer pairs, such as forty Mo/Si pairs (where N=80; layers $122_1$, $122_3$, . . . $122_{79}$ include silicon and have a thickness of about 2 nm to about 6 nm (for example, about 4 nm); and layers $122_2$, $122_4$, . . . $122_{80}$ include molybdenum and have a thickness of about 1 nm to about 5 nm (for example, 3 nm). Alternatively, the RMLC 120 includes any other number of layer pairs, depending on reflectivity specifications for the mask 100. In other alternatives, the RMLC 120 may include layer groups, in other words, groups of three or more layers having different refractive indices and other characteristics to maximize reflectivity.

The RMLC 120 includes a phase defect region that alters a phase of light reflected from the RMLC 120. In the depicted embodiment, a defect 130, such as a bump defect, is located at the surface 112 of the substrate 110. As illustrated in FIG. 1, the defect 130 causes a deformation in the layers of the RMLC 120 deposited on the surface 112 of the substrate 110. More specifically, a deformation occurs in each of the layers $122_1$, $122_2$, $122_3$, $122_4$, . . . $122_N$ of the RMLC 120. The defect 130 thus propagates into each successively formed layer, such that the phase defect region of the RMLC 120 extends from the bottommost layer (layer $122_1$) to the topmost layer (layer $122_N$). Alternatively, the phase defect region extends through a limited number of the layers $122_1$, $122_2$, $122_3$, $122_4$, . . . $122_N$ of the RMLC 120. In yet another alternative, where the phase defect region extends through a limited number of the layers $122_1$, $122_2$, $122_3$, $122_4$, . . . $122_N$, a defect in/on one of the layers causes deformations in the subsequently deposited layers, such that the deformations in the subsequently deposited layers are associated with the defect in/on the layer, instead of a defect in the substrate 110, such as the defect 130. Each of the deformations of the layers $122_1$, $122_2$, $122_3$, $122_4$, . . . $122_N$ associated with the defect 130 is located at a substantially same lateral location, in the present example, a substantially same x-coordinate. For example, each deformation has a profile having a full width at half maximum (FWHM), and in the depicted embodiment, a lateral location of a center of each deformation's FWHM has a substantially same x-coordinate, while a vertical location of the center of each deformation's FWHM is at a different y-coordinate. The location of the center of each deformation's FWHM is thus at substantially the same lateral location for layers $122_1$, $122_2$, $122_3$, $122_4$, . . . $122_N$. The x- and y-coordinates are merely used for example, and thus are not intended to be limiting. Further, the profile of the deformations in layers $122_1$, $122_2$, $122_3$, $122_4$, . . . $122_N$ illustrated in FIG. 1 are merely examples, and the deformations of the RMLC 120 may have a different profile depending on the type of defect associated with the deformations and the processing conditions during the forming of the layers $122_1$, $122_2$, $122_3$, $122_4$, . . . $122_N$ of the RMLC 120.

Light reflected from the RMLC 120 consists of the light reflected from the different interfaces of the RMLC 120. In the present example, light reflected from the different interfaces in the phase defect region are phase shifted (in other words, have phase errors) because of the deformations of the layers $122_1$, $122_2$, $122_3$, $122_4$, . . . $122_N$ in the RMLC 120 (here, resulting from the defect 130). The illustrated phase defect region (the collection of deformations in the layers of the RMLC 120) thus largely impacts a phase of the light reflected from the RMLC 120, though it may minimally impact an amplitude of such reflected light. When small imaging wavelengths, such as EUV wavelengths, are used with the mask 100, the phase errors introduced in the reflected light by the phase defect region of the RMLC 120 can be large, even if the deformations in the layers $122_1$, $122_2$, $122_3$, $122_4$, . . . $122_N$ associated with the phase defect region of the RMLC 120 may be small. For example, when the imaging wavelength is 13.5 nm, a defect having a height or depth of about 3.4 nm (about one fourth of the imaging wavelength) can introduce a phase error as much as 180°. Such phase shifts (errors) resulting from the phase defect region of the RMLC 120 thus negatively impact the lithography processes using the mask 100. In fact, a phase error smaller than 180°, for example, as small as 20°, can negatively impact a lithography process window or patterning fidelity using the mask 100. Accordingly, it is desired that the substrate 110 (particularly the surface 112 of the substrate 110), as well as the RMLC 120, is free of defects, such as bump defects, pit defects, and other types of defects. However, achieving a defect free substrate, as well as a defect free RMLC, is difficult using conventional technology. The following discussion thus examines how to reduce the impact of such defects, particularly, the impact of phase defect regions that result from such defects.

Figure 2:
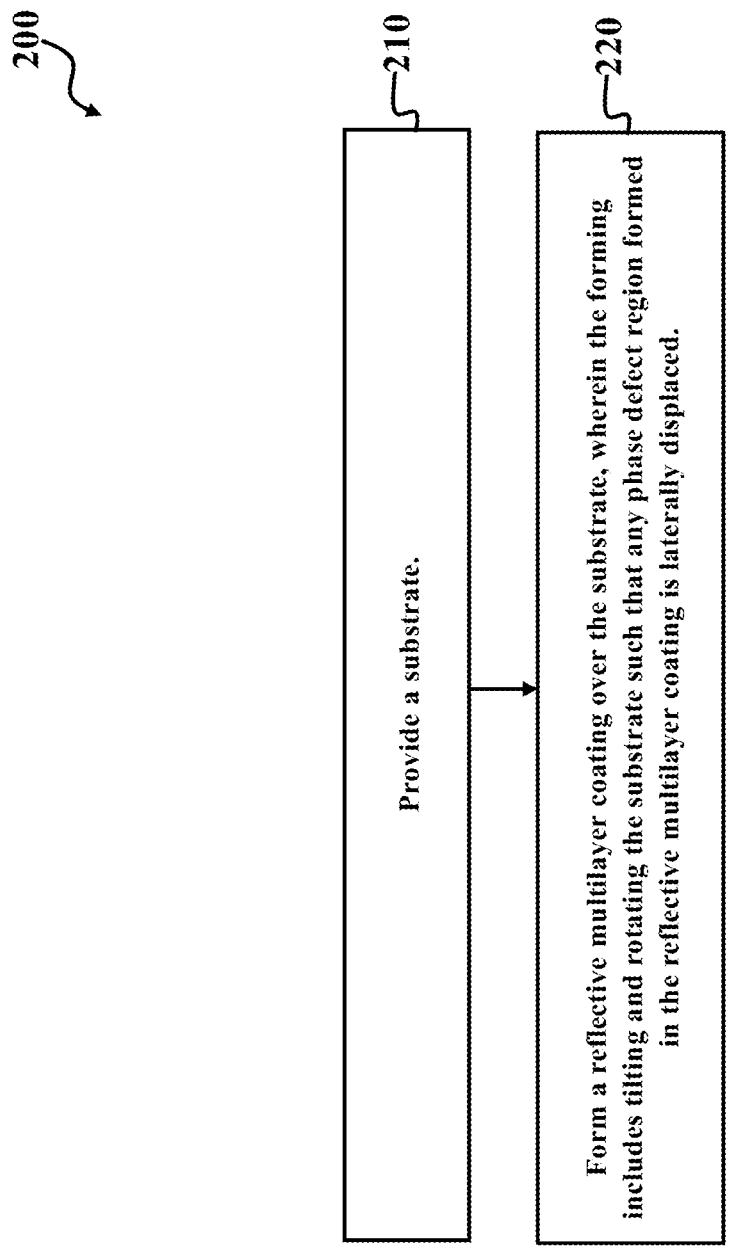
FIG. 2 is a flow chart of a method for forming a material layer of a mask according to various aspects of the preset disclosure.
Figure 3:
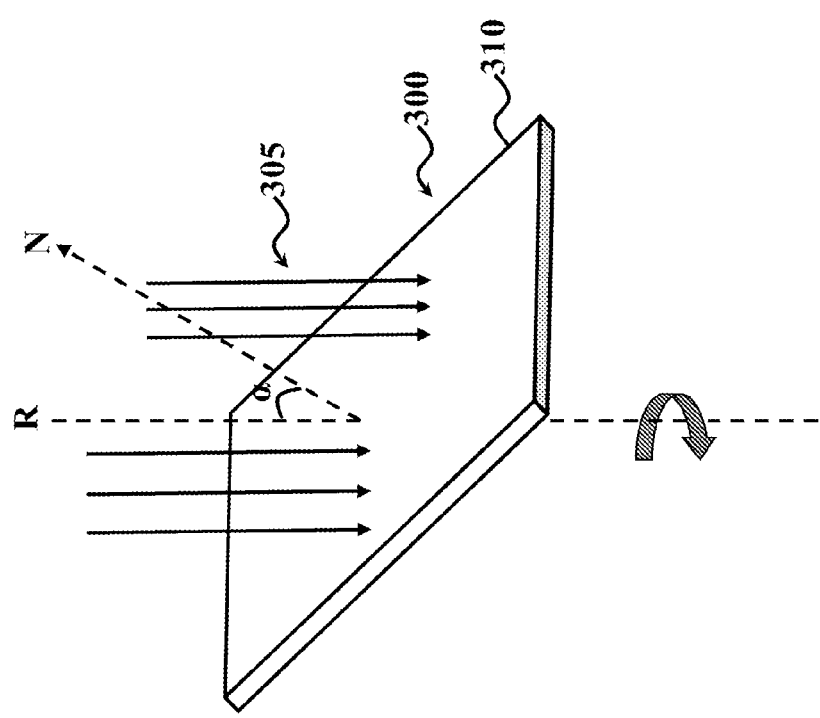
FIG. 3 is a schematic view of forming a material layer of a mask using the method of FIG. 2 according to various aspects of the present disclosure.
Figure 4:
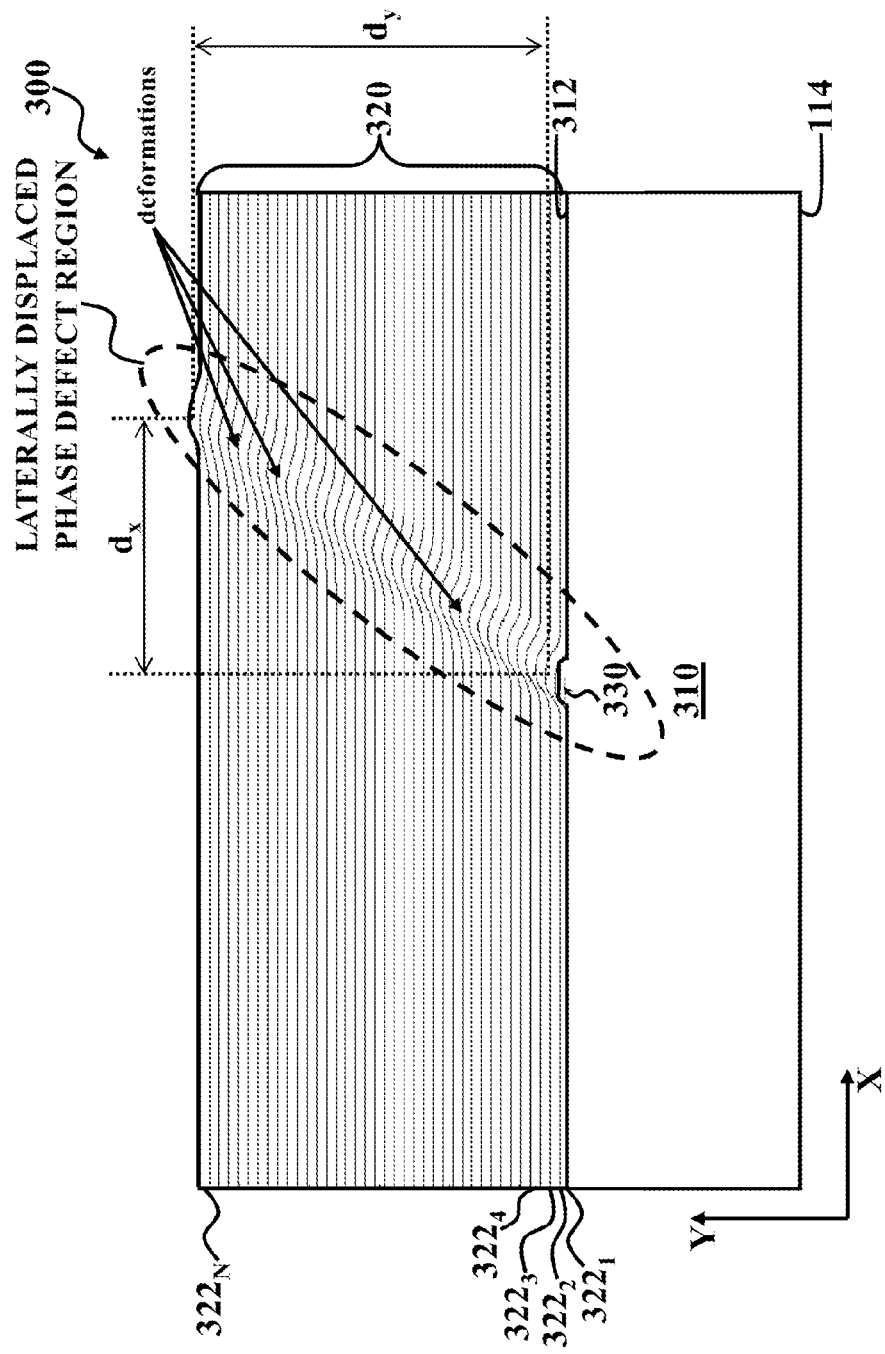
FIG. 4 is a diagrammatic cross-sectional side view of a mask fabricated using the method of FIG. 2 according to various aspects of the present disclosure.

FIG. 2 is a flow chart of a method 200 for forming a layer of a mask, and FIG. 3 is a schematic view of forming a layer of a mask using the method 200 of FIG. 2, according to various aspects of the present disclosure. In the present example, the method 200 forms a reflective multilayer coating (RMLC) of a mask 300. Alternatively, the method 200 may be used to form other layers of the mask 300. FIG. 4 is a diagrammatic cross-sectional side view of a mask, such as the mask 300, fabricated using the method of FIG. 2, according to various aspects of the present disclosure. FIGS. 2-4 will be discussed concurrently and have been simplified for the sake of clarity to better understand the inventive concepts of the present disclosure. Additional steps can be provided before, during, and after the method 200, and some of the steps described can be replaced or eliminated for additional embodiments of the method 200. Additional features can be added in the mask 300, and some of the features described below can be replaced or eliminated for additional embodiments of the mask 300.

Referring to FIGS. 2-4, at block 210, a substrate 310 of the mask 300 is provided. The substrate 310 has a surface 312 and a surface 314 that is opposite the surface 312. In the present example, the substrate 310 includes a low thermal expansion material (LTEM), such as titania ($TiO_2$) doped fused silica ($SiO_2$). Alternatively, the substrate 310 includes other materials depending on design requirements of the mask 300. The substrate 310 includes a defect 330 located at the surface 312. In the present example, the defect 330 is a bump defect. The defect 330 may alternatively be a pit defect or other type of surface defect.

At block 220, a reflective multilayer coating (RMLC) 320 (also referred to as a multilayer mirror (MLM)) is formed over the substrate 310, particularly over the surface 312 of the substrate 310. The RMLC 320 includes multiple layers $322_1$, $322_2$, $322_3$, $322_4$, ... $322_N$, where N is a total number of the layers of the RMLC 320. Hereafter, for ease of discussion, "a material layer" or "material layers" is simply referred to as "a layer" or "layers." In the present example, in relation to the surface 312 of the substrate 310, the layer $322_1$ may be referred to as a bottommost layer of the RMLC 320, and the layer $322_N$ may be referred to as a topmost layer of the RMLC 320. In furtherance of the present example, the multiple layers $322_1$, $322_2$, $322_3$, $322_4$, ... $322_N$ form a number of layer pairs, where each layer pair includes two layers having different refractive indices (in other words, a combination of a first material and a second material, where a refractive index of the first material is different than a refractive index of the second material). For example, a layer pair includes layer $322_1$ and layer $322_2$, another layer pair includes layer $322_3$ and layer $322_4$, and so forth. The combination of the materials in the layer pair is selected to provide a large difference in refractive indices between the two layers (for example, to achieve large reflectivity at an interface of the two layers according to Fresnel equations), yet provide small extinction coefficients for the layers (for example, to minimize absorption). In an example, the RMLC 320 includes molybdenum-silicon (Mo/Si) layer pairs. In another example, the RMLC 320 includes molybdenum-beryllium (Mo/Be) layer pairs. A thickness of each layer of each layer pair of the RMLC 320 is adjusted depending on a wavelength and an angle of incidence of light (such as extreme ultraviolet (EUV) radiation) incident on the mask 300, such that the mask 300 achieves maximum constructive interference of light reflected from different interfaces of the RMLC 320. In general, reflectivity of the RMLC increases as a number of layer pairs of the RMLC 320 increases. Accordingly, in principle, if the number of layer pairs is sufficiently large and extinction coefficients of the materials of the layers of the layer pairs are close to zero, reflectivity of the RMLC 320 can approach 100% regardless of the difference of the refractive indices of the materials of the layers in the layer pairs. However, in the EUV wavelength range, the highest reflectivity that can be achieved is limited by the extinction coefficients of the materials employed for the layers of the RMLC 320. In the present example, the number of layer pairs of the RMLC 320 is about twenty pairs to about eighty pairs. For example, in the depicted embodiment, to achieve more than 95% reflectivity of the RMLC 320 and minimize mask blank manufacturing time and costs, the RMLC 320 includes about forty layer pairs, such as forty Mo/Si pairs (where N=80; layers $322_1$, $322_3$, ... $322_{79}$ include silicon and have a thickness of about 2 nm to about 6 nm (for example, about 4 nm); and layers $322_2$, $322_4$, ... $322_{80}$ include molybdenum and have a thickness of about 1 nm to about 5 nm (for example, 3 nm). Alternatively, the RMLC 320 includes any other number of layer pairs, depending on reflectivity specifications for the mask 300. In other alternatives, the RMLC 320 may include layer groups, in other words, groups of three or more layers having different refractive indices and other characteristics to maximize reflectivity.

During the forming of the RMLC 320, the substrate 310 is tilted and rotated such that any deformation formed in the RMLC 320 is laterally displaced. In FIG. 3, lines 305 represent particles landing on the substrate 310 during the forming of the RMLC 320. The particles landing on the substrate 310 form the various layers $322_1$, $322_2$, $322_3$, $322_4$, ... $322_N$ of the RMLC 320. In an example, an ion beam sputtering process forms the RMLC 320, and the lines 305 represent sputtered particles landing on the substrate 310. Alternatively, other deposition processes may be used to form the RMLC 320. In FIG. 3, a line (or axis) R, represents a line parallel with a landing direction of the particles (lines 305). The substrate 310 is tilted such that an angle α is formed between a normal line (N) of the substrate 310 and the landing direction of the particles (lines 305) landing on the substrate 310, and rotated about an axis that is parallel with the landing direction of the particles (lines 305). The angle α is greater than 0°, for example, the angle α is greater than about 20° and less than about 70°. In the present example, the substrate 310 is rotated about the line (or axis) R, which is parallel with the landing direction of the particles (lines 305). The substrate 310 may be rotated about other lines (or axes) that are parallel with the landing direction of the particles.

By tilting the substrate 310 such that the angle α is formed between the normal line (N) of the substrate 310 and a landing direction of the particles (lines 305) and rotating the substrate 310 about the axis that is parallel with the landing direction of the particles (lines 305), any deformation formed in at least two layers of the RMLC 320 is laterally displaced. In FIG. 4, the RMLC 320 includes a laterally displaced phase defect region, achieved by the tilting and rotating of the substrate 310 as depicted in FIG. 3. In the depicted embodiment, the laterally displaced phase defect region of the RMLC 320 is associated with the defect 330 located at the surface 312 of the substrate 310, such that the laterally displaced phase defect region extends from the bottommost layer (layer $322_1$) to the topmost layer (layer $322_N$), where each of the deposited layers $322_1$, $322_2$, $322_3$, $322_4$, ... $322_N$ includes a deformation associated with the defect 330. Alternatively, the laterally displaced phase defect region extends through a limited number of the layers $322_1$, $322_2$, $322_3$, $322_4$, ... $322_N$ of the RMLC 320. In yet another alternative, where the laterally displaced phase defect region extends through a limited number of the layers $322_1$, $322_2$, $322_3$, $322_4$, ... $322_N$, a defect in/on one of the layers causes deformations in the subsequently deposited layers, such that deformations in the subsequently deposited material layers are associated with the defect in/on the layer, instead of a defect in/on the substrate 310, such as the defect 330.

By tilting and rotating the substrate 310 as depicted in FIG. 3 during the forming of the RMLC 320, a lateral position (location) of the deformations in each of the layers $322_1$, $322_2$, $322_3$, $322_4$, ..., or $322_N$ of the RMLC 320 is shifted by a displacement in a same direction (in the present example, in the right direction as shown in FIG. 4) with respect to a lateral location of the deformation of the previously deposited layer $322_1$, $322_2$, $322_3$, $322_4$, ..., or $322_N$. For example, a lateral location of the deformation in the layer $322_2$ is displaced a distance in the positive x-direction from a lateral location of the deformation in the layer $322_1$; a lateral location of the deformation in the layer $322_4$ is displaced a distance in the positive x-direction from a lateral location of the deformation in the layer $322_3$; and so on. Each of the deformations of the layers $322_1$, $322_2$, $322_3$, $322_4$, ... $322_N$ associated with the defect 330 is thus located at a different lateral location, in the present example, a different x-coordinate position. In the depicted embodiment, each deformation has a profile having a full width at half maximum (FWHM), and a lateral location of a center of each deformation's FWHM has a different x-coordinate, and a vertical location of the center of each deformation's FWHM is at a different y-coordinate. As noted, the lateral location shifts a distance in a same direction, the right direction, for each subsequently deposited layer. More specifically, a lateral location of the center of the FWHM of the deformation in the layer $322_2$ is displaced laterally to the right a distance from a lateral location of the center of the FWHM of the deformation in the layer $322_1$; a lateral location of the center of the FWHM of the deformation in the layer $322_4$ is displaced laterally to the right a distance from a lateral location of the center of the FWHM of the deformation in the layer $322_3$; and so on. In an example, a lateral location of the center of the FWHM of the deformation in the layer $322_N$ is displaced laterally to the right a distance, $d_x$, from a lateral location of the center of the FWHM of the deformation in the layer $322_1$, and a vertical location of the center of the FWHM of the deformation in the layer $322_N$ is displaced vertically a distance, $d_y$, from a vertical location of the center of the FWHM of the deformation in the layer $322_1$. In an example, lateral displacement between the deformation in the layer $322_1$ and the deformation in the layer $322_N$ is about 0.5 times to about 2.5 times the vertical displacement between the deformations of the layers $322_1$ and $322_N$ (in other words, $2.5\,d_y \geq d_x \geq 0.5\,d_y$). The x- and y-coordinates, and the shifting direction, are merely used for example, and thus are not intended to be limiting. Further, the profile of the deformations in layers $322_1$, $322_2$, $322_3$, $322_4$, ... $322_N$ illustrated in FIG. 4 are merely examples, and the deformations of the RMLC 320 may have a different profile depending on the type of defect associated with the deformations and the processing conditions during the forming of the layers $322_1$, $322_2$, $322_3$, $322_4$, ... $322_N$ of the RMLC 320. In the present example, a thickness of each layer in a left side of the deformation is different than a thickness of the layer in a right side of the deformation. Referring to layer $322_1$, a thickness of the layer $322_1$ in a left side of the deformation is less than a thickness of the layer $322_1$ in a right side of the deformation. In an example, shifting of the lateral location of each deformation may result from such thickness variation, which can occur when an amount of particles landing on the left side of the defect 330 is different than an amount of particles landing on the right side of the defect 330. The thickness variation in the deformation's profiles of the RMLC 320 illustrated in FIG. 4 is merely an example, as any deformation profile is contemplated by the present disclosure so long as a lateral location of a deformation associated with the phase defect region in a layer of the RMLC 320 shifts with respect to a deformation associated with the phase defect region in a previously deposited layer of the RMLC 320.

The laterally displaced phase defect region of the RMLC 320, similar to the phase defect region of the RMLC 120 illustrated in FIG. 1, alters a phase of light reflected from the RMLC 320. However, when compared to the phase defect region of the RMLC 120, the laterally displaced phase defect region significantly reduces the accumulated phase shift error and thus reduces its impact on the light reflected from the RMLC 320. More specifically, though each deformation in the layers $322_1$, $322_2$, $322_3$, $322_4$, ... $322_N$ of the RMLC 320 causes a phase shift (error) in light reflected therefrom, because the deformations in the layers $322_1$, $322_2$, $322_3$, $322_4$, ... $322_N$ are laterally displaced from one another (in other words, the lateral location of each deformation is different), light incident on the RMLC 320 sees fewer deformations, resulting in fewer phase shifts (errors) in the light reflected from the RMLC 320. In an example, the collective phase shift error can result in constructive interference from the RMLC 320. The laterally displaced phase defect region of the RMLC 320 can thus enhance imaging in lithography processes using the mask 300, even though the mask 300 includes the defect 330 and associated laterally displaced phase defect region. It has also been observed that a laterally displaced phase defect region in a reflective multilayer coating, such as the laterally displaced defect region of RMLC 320, associated with bump defects at the surface of a substrate, pit defects at the surface of the substrate, other defects at the surface of the substrate, or defects in the reflective multilayer coating reduces printability of such defects or phase defect regions, which can reduce line edge roughness contributed by such defects or phase defect regions. An allowable size of a defect or phase defect region in a mask may thus be increased since the negative impact on the lithography process resulting from such defect or phase defect region is reduced by the lateral displacement characteristic, which increases a yield of mask blanks in mask manufacturing. Different embodiments may have different advantages, and no advantages are necessarily required of any embodiment.

The present disclosure provides for many different embodiments. An exemplary method includes forming a reflective multilayer coating over a substrate by tilting the substrate such that an angle α is formed between a normal line of the substrate and a landing direction of particles on the substrate and rotating the substrate about an axis that is parallel with the landing direction of the particles. The angle α may remain fixed during the forming of the reflective multilayer coating. In an example, the angle α is greater than about 20 degrees and less than about 70 degrees. In an example, the forming the reflective multilayer coating includes depositing a plurality of layers over the substrate, such that the reflective multilayer coating includes a first layer and a second layer deposited over the first layer; and the substrate is tilted and rotated during the forming of the reflective multilayer coating such that a lateral location of a deformation in the second layer of the reflective multilayer coating is displaced by a distance from a lateral location of a deformation in the first layer of the reflective multilayer coating. In an example, a defect is located at a surface of the substrate over which the reflective multilayer coating is formed; and the substrate is tilted and rotated during the forming of the reflective multilayer coating such that an amount of particles landing on a first side of the defect is different than an amount of particles landing on a second side of the defect. In an example, the substrate is tilted and rotated during the forming of the reflective multilayer coating such that a lateral location of a deformation associated with the defect in a topmost layer of the reflective multilayer coating is displaced by a distance from a lateral location of the defect located at the surface of the substrate. In another example, the reflective multilayer coating includes a defect, a first layer, and a second layer deposited over the first layer; and the substrate is tilted and rotated during the forming of the reflective multilayer coating such that a lateral location of a deformation associated with the defect in the second layer of the reflective multilayer coating is displaced by a distance from a lateral location of a deformation associated with the defect in the first layer of the reflective multilayer coating.

An exemplary method for fabricating a mask includes depositing a reflective multilayer coating over a substrate such that a lateral location of a deformation in a subsequently deposited layer of the reflective multilayer coating is displaced by a distance from a lateral location of a deformation in a previously deposited layer of the reflective multilayer coating, the subsequently deposited layer being deposited above the previously deposited layer. The depositing the reflective multilayer coating over the substrate includes tilting and rotating the substrate to achieve the displaced lateral location of the deformation in the subsequently deposited layer of the reflective multilayer coating. In an example, the substrate is rotated about an axis that is parallel with a landing direction of deposited particles, and tilted such that an angle α is formed between a normal line of the substrate and a landing direction of deposited particles. An ion beam sputtering process may be used to deposit the reflective multilayer coating. In an example, depositing the reflective multilayer coating includes depositing a plurality of layer pairs, where each layer pair includes a molybdenum layer and a silicon layer.

An exemplary mask includes a substrate; and a reflective multilayer coating deposited over the substrate, the reflective multilayer coating having a first layer and a second layer deposited over the first layer. Due to the presence of a defect, the reflective multilayer coating has a phase defect region that includes a first deformation in the first layer at a first location, and a second deformation in the second layer at a second location, the second location being laterally displaced from the first location. The second location is also vertically displaced from the first location. In an example, the phase defect region corresponds with a substrate defect located at a surface of the substrate; the reflective multilayer coating is deposited over the surface of the substrate; and the first location of the first deformation in the first layer is laterally displaced from a location of the substrate defect by a first distance and the second location of the second deformation in the second layer is laterally displaced from the location of the substrate defect by a second distance. The second distance is greater than the first distance. The first location may be referred to as a first lateral location (such as an x-coordinate of the first location), and the second location may be referred to as a second lateral location (such as an x-coordinate of the second location). The first layer may be a bottommost layer of the reflective multilayer coating, and the second layer may be a topmost layer of the reflective multilayer coating. Additional layers may be between the first layer and the second layer, where each of the additional layers includes a deformation and a location of the deformation shifts laterally in successive additional layer between the first layer and the second layer. In an example, the substrate is a low thermal expansion material (LTEM) substrate, and the reflective multilayer coating includes multiple layer pairs, such as silicon-molybdenum (Si—Mo) layer pairs. In an example, the first deformation in the first layer includes a first portion of the first layer having a first thickness and a second portion of the first layer having a second thickness, the first thickness being less than the second thickness; and the second deformation in the second layer includes a first portion of the second layer having a third thickness and a second portion of the second layer having a fourth thickness, the third thickness being less than the fourth thickness. In an example, the reflective multilayer coating includes additional layers deposited between the first layer and the second layer, where each of the additional layers includes a deformation. A lateral location of the deformation in each additional layer is displaced in a same direction with respect to a lateral location of a deformation of a previously deposited additional layer.

An exemplary lithography process may use the mask described herein. For example, the lithography process includes providing a mask having a pattern, wherein the mask includes a substrate, and a reflective multilayer coating deposited over the substrate, the reflective multilayer coating having a first layer and a second layer deposited over the first layer. The reflective multilayer coating has a phase defect region that includes a first deformation in the first layer at a first location, and a second deformation in the second layer at a second location, the second location being displaced laterally from the first location. The lithography process further includes projecting radiation onto the mask such that the mask transfers a portion of the radiation to a wafer, thereby transferring the pattern of the mask to the wafer. In an example, the radiation is extreme ultraviolet (EUV) radiation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming at least a reflective layer over a substrate, the method comprising:
   tilting the substrate;
   rotating the substrate;
   depositing a first layer;
   depositing a second layer; and
   wherein the substrate is tilted and rotated during the depositing of the first and the second layers such that a lateral location of a deformation in the second layer is displaced by a distance from a lateral location of a deformation in the first layer.

2. The method of claim 1, wherein the substrate is rotated about an axis that is parallel with a landing direction of particles.

3. The method of claim 1, wherein the substrate is tilted such that an angle is formed between a normal line of the substrate and a landing direction of particles on the substrate.

4. The method of claim 3, wherein the angle remains fixed during the forming of at least one of the first and the second layers.

5. The method of claim 1, wherein the displaced distance includes a lateral displacement and a vertical displacement.

6. The method of claim 5, wherein the lateral displacement between the deformation in the first layer and the deformation in the second layer is about 0.5 times to about 2.5 times the vertical displacement between the deformation in the first layer and the deformation in the second layer.

7. The method of claim 1, wherein a defect is located at a surface of the substrate over which the first and the second layers are deposited such that after the depositing of the at least one of the first and the second layers, an amount of particles landing on a first side of the defect is different than an amount of particles landing on a second side of the defect.

8. The method of claim 7, wherein after the depositing of the at least one of the first and the second layers, a lateral location of a deformation associated with the defect in a topmost layer of the first and the second layers is displaced by a distance from a lateral location of the defect located at the surface of the substrate.

9. The method of claim 1, wherein a defect is located at a surface of the substrate over which the first and the second layers is deposited such that after the depositing of the first and the second layers, a lateral location of a deformation associated with the defect in one of the first and the second layers is displaced by a distance from a lateral location of a deformation associated with the defect in another one of the first and the second layers.

10. A method comprising:
depositing a first layer; and
depositing a second layer,
wherein a lateral location of a deformation in the second layer is displaced by a distance from a lateral location of a deformation in the first layer, the second layer is deposited above the first layer, and the deformation in the first layer is associated with a defect and the deformation in the second layer is associated with the defect, wherein the defect is located at a surface of a substrate over which the first and the second layers are deposited.

11. The method of claim 10, wherein the method further includes:
tilting the substrate; and
rotating the substrate.

12. The method of claim 11, wherein the rotating the substrate includes rotating the substrate about an axis that is parallel with a landing direction of deposited particles.

13. The method of claim 11, wherein the tilting the substrate includes orienting the substrate such that an angle is formed between a normal line of the substrate and a landing direction of deposited particles.

14. The method of claim 10, wherein the depositing the first and the second layers is performed by an ion beam sputtering process.

15. A method comprising:
forming a first layer over a substrate, wherein the first layer has a first deformation;
forming a second layer over the first layer, wherein the second layer has a second deformation, and there is a displacement between the second deformation and the first deformation in a top view toward the substrate, and the first deformation is associated with a defect and the second deformation is associated with the defect.

16. The method of claim 15, wherein the forming of one of the first and the second layers includes depositing particles.

17. The method of claim 16, further comprising:
tilting the substrate such that an angle is formed between a normal line of the substrate and a landing direction of the particles; and
rotating the substrate about an axis that is parallel with the landing direction.

18. The method of claim 15, wherein:
the first deformation includes a first portion of the first layer having a first thickness and a second portion of the first layer having a second thickness, the first thickness being less than the second thickness; and
the second deformation includes a third portion of the second layer having a third thickness and a fourth portion of the second layer having a fourth thickness, the third thickness being less than the fourth thickness.

19. The method of claim 15, wherein the defect is located at a surface of the substrate.

20. The method of claim 15, wherein the defect is located at a surface of an interlayer above the substrate, the interlayer being under the first layer and the second layer.

* * * * *